(12) United States Patent
Yamada

(10) Patent No.: US 8,427,035 B2
(45) Date of Patent: Apr. 23, 2013

(54) VIBRATION DEVICE AND ELECTRONIC DEVICE

(75) Inventor: Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 360 days.

(21) Appl. No.: 12/917,855

(22) Filed: Nov. 2, 2010

(65) Prior Publication Data

US 2011/0109205 A1 May 12, 2011

(30) Foreign Application Priority Data

Nov. 11, 2009 (JP) ................................. 2009-257704
Sep. 2, 2010 (JP) ................................. 2010-196512

(51) Int. Cl.
*H01L 41/08* (2006.01)
*H03H 9/21* (2006.01)
*H03H 9/215* (2006.01)

(52) U.S. Cl.
USPC ........................................................ 310/370

(58) Field of Classification Search ................... 310/370
See application file for complete search history.

(56) References Cited

U.S. PATENT DOCUMENTS

| | | | | |
|---|---|---|---|---|
| 3,697,766 | A * | 10/1972 | Ganter et al. | 310/348 |
| 6,587,009 | B2 * | 7/2003 | Kitamura et al. | 331/158 |
| 6,894,428 | B2 | 5/2005 | Tanaya et al. | |
| 6,927,530 | B2 | 8/2005 | Tanaya et al. | |
| 2005/0062368 | A1 * | 3/2005 | Hirasawa et al. | 310/370 |
| 2007/0188055 | A1 * | 8/2007 | Kuwahara | 310/370 |
| 2008/0211350 | A1 | 9/2008 | Tanaya et al. | |

FOREIGN PATENT DOCUMENTS

| | | | |
|---|---|---|---|
| JP | 51-010755 | | 3/1976 |
| JP | 56094813 | A * | 7/1981 |
| JP | 63-110151 | | 7/1988 |
| JP | 02-032229 | | 2/1990 |
| JP | 2002-280870 | | 9/2002 |
| JP | 2008118501 | A * | 5/2008 |

OTHER PUBLICATIONS

Zener, Clarence, "Internal Friction in Solids I, Theory of Internal Friction in Reeds", Physical Review, vol. 52, pp. 230-235, Aug. 1, 1937.
Zener, Clarence et al., "Internal Friction in Solids II, General Theory of Thermoelastic Internal Friction", Physical Review, vol. 53, pp. 90-99, Jan. 1, 1938.

(Continued)

*Primary Examiner* — J. San Martin
(74) *Attorney, Agent, or Firm* — Harness, Dickey & Pierce, P.L.C.

(57) ABSTRACT

A vibration device includes: a vibrating reed including a base having a notch, a plurality of vibrating arms extending from the base, and each including an arm section, a weight section, and a groove section, and a support section, wherein a mechanical resonant frequency f of the vibrating reed is higher than a thermal relaxation frequency $f_0$ of the vibrating reed, and assuming that a closest approach distance between the notch and a crotch section formed between the vibrating arms is a base flexion width Wb, and an arm width of the vibrating arm in a case of replacing a cross-sectional shape of the vibrating arm having a thermoelastic loss equivalent to a thermoelastic loss of the cross-sectional shape and a thickness equal to a thickness of the cross-sectional shape is an effective arm width We, a relationship of Wb>We is satisfied.

8 Claims, 5 Drawing Sheets

OTHER PUBLICATIONS

Zener, Clarence et al., "Internal Friction in Solids III, Experimental Demonstration of Thermoelastic Internal Friction", Physical Review, vol. 53, pp. 100-101, Jan. 1, 1938.

Itoh, Hideaki et al., "Analysis of Q-Value of Quartz Crystal Tuning Fork Using Thermoelastic Coupling Equations", Japanese Journal of Applied Physics 48, 2009.

Itoh, Hideaki, et al., "Analysis of Q-Value of a Quartz-Crystal Tuning-Fork Using Thermoelastic Equations", $36^{th}$ Symposium, pp. 5-8, May 17, 2007.

Roszhart, Terry V., "The Effect of Thermoelastic Internal Friction on the Q of Micromachined Silicon Resonators", Solid-State Sensor and Actuator Workshop, 1990, $4^{th}$ Technical Digest IEEE, Jan. 4, 1990.

* cited by examiner

VIBRATION DEVICE AND ELECTRONIC DEVICE

The entire disclosure of Japanese Patent Application Nos: 2009-257704, filed Nov. 11, 2009 and 2010-196512, filed Sep. 2, 2010 are expressly incorporated by reference herein.

BACKGROUND

1. Technical Field

The present invention relates to a vibration device equipped with a vibrating reed vibrating in a flexural mode and an electronic device equipped with the vibration device.

2. Related Art

JP-A-2002-280870 (Document 1) discloses a vibrating reed having a base and vibrating arm sections (hereinafter referred to as vibrating arms) formed to be projected from the base, wherein each of the vibrating arms is provided with a groove section, and the base is provided with notches.

Further, JP-UM-B-51-10755 (Document 2) discloses a tuning-fork vibrator (hereinafter referred to as a vibrating reed) provided with an additional mass section (hereinafter referred to as a weight section) on each of the tips of a tuning fork having a U-shape, and having support sections projected on both outer sides of a base of the tuning fork in a lateral or upper lateral direction.

Since the vibrating reed described in Document 1 is provided with the notch in the base, the vibration leakage from the vibrating arms to the base is reduced, and the prevention of the variation in the CI value (the Q-value) is achieved. However, in the vibrating reed described in Document 1 fails to achieve improvement of the Q-value even with the configuration thereof. Since the vibrating reed described in Document 2 is provided with the weight section at the tips of the tuning fork (hereinafter referred to as vibrating arms), improvement of the Q-value is achieved without elongating the vibrating arms.

However, since the vibrating reed described in Document 2 has the configuration of projecting the support sections on the both sides of the base toward the lateral or upper lateral direction, it is difficult to achieve the improvement of the Q-value without enlarging the base including the support sections.

SUMMARY

An advantage of some aspects of the invention is to provide a solution to at least a part of the problem described above, and the invention can be embodied as forms or application examples described below.

APPLICATION EXAMPLE 1

According to this application example of the invention, there is provided a vibration device including a vibrating reed including a base having a notch between one end and the other end, a plurality of vibrating arms extending from the one end of the base, and each including an arm section, a weight section located on an opposite side of the arm section to the base side and having a width larger than a width of the arm section, and a groove section provided to at least one of both principal surfaces of the arm section along a longitudinal direction of the arm section, and a support section connected to the other end of the base, wherein a mechanical resonant frequency f of the vibrating reed is higher than a thermal relaxation frequency $f_0$ of the vibrating reed, and assuming that a closest approach distance between an outer edge of the notch and an outer edge of a crotch section formed between the vibrating arms is a base flexion width Wb, and an arm width of the vibrating arm in a case of replacing a cross-sectional shape of the vibrating arm in a plane perpendicular to the longitudinal direction of the vibrating arm with a rectangular shape having a thermoelastic loss equivalent to a thermoelastic loss of the cross-sectional shape and a thickness equal to a thickness of the cross-sectional shape is an effective arm width We, a relationship of Wb>We is satisfied.

According to this application example of the invention, in the vibration device, since the thermoelastic loss caused in the cross-sectional surface of the base of the vibrating reed becomes smaller than the thermoelastic loss caused in the cross-sectional surface of the vibrating arm, the deterioration of the Q-value of the vibrating reed caused by the thermoelastic loss of the base is prevented, and the improvement of the Q-value can be achieved.

Further, since the vibration device has fewer parameters to be fed-back compared to a vibration device according to an application example 2 of the invention described later, reduction of design time of the vibrating reed can be achieved.

APPLICATION EXAMPLE 2

According to this application example of the invention, there is provided a vibration device including a vibrating reed including a base having a notch between one end and the other end, a plurality of vibrating arms extending from the one end of the base, and each including an arm section, a weight section located on an opposite side of the arm section to the base side and having a width larger than a width of the arm section, and a groove section provided to at least one of both principal surfaces of the arm section along a longitudinal direction of the arm section, and a support section connected to the other end of the base, wherein a mechanical resonant frequency f of the vibrating reed is higher than a thermal relaxation frequency $f_0$ of the vibrating reed, and assuming that a closest approach distance between an outer edge of the notch and an outer edge of a crotch section formed between the vibrating arms is a base flexion width Wb, an arm width of the vibrating arm in a case of replacing a cross-sectional shape of the vibrating arm in a plane perpendicular to the longitudinal direction of the vibrating arm with a rectangular shape having a thermoelastic loss equivalent to a thermoelastic loss of the cross-sectional shape and a thickness equal to a thickness of the cross-sectional shape is an effective arm width We, a temperature difference caused in conjunction with a flexural vibration between the outer edge of the notch and the outer edge of the crotch section is $d\Theta_b$, and a temperature difference caused in conjunction with a flexural vibration between both ends of a root section of the vibrating arm in an arm width direction is $d\Theta$, the following relationship is satisfied: $Wb > We \times d\Theta_b/d\Theta$ (where $d\Theta_b < d\Theta$).

According to this application example of the invention, in the vibration device, since the thermoelastic loss caused in the cross-sectional surface of the base of the vibrating reed becomes smaller than the thermoelastic loss caused in the cross-sectional surface of the vibrating arm, the deterioration of the Q-value of the vibrating reed caused by the thermoelastic loss of the base is prevented, and the improvement of the Q-value can be achieved.

In addition, in the vibration device, since the ratio between the temperature difference $d\Theta_b$ caused in the base and the temperature difference $d\Theta$ caused in the vibrating arm is reflected in the relationship between the base flexion width Wb and the effective arm width We, the base flexion width Wb and the effective arm width We can be set in a range broader than that of the application example 1.

APPLICATION EXAMPLE 3

In the vibration device of the above application example of the invention, it is preferable that the support section has a first projecting section extending from the other end of the base in a direction substantially perpendicular to the longitudinal direction of the vibrating arm, and a second projecting section extending from the first projecting section in a direction in which the vibrating arm extends.

According to this application example of the invention, the vibration device can prevent the vibration inhibition to the vibrating arms caused by the support section.

APPLICATION EXAMPLE 4

It is preferable that the vibration device according to the above application example of the invention is an oscillator provided with an IC chip adapted to drive the vibrating reed.

According to this application example of the invention, an oscillator having the advantages described in either one of the application examples 1 to 3 of the invention can be provided as the vibration device.

APPLICATION EXAMPLE 5

According to this application example of the invention, there is provided an electronic device having the vibration device according to any one of the application examples 1 to 4 of the invention.

According to this application example of the invention, an electronic device having the advantages described in any one of the application examples 1 to 4 of the invention can be provided.

BRIEF DESCRIPTION OF THE DRAWINGS

The invention will be described with reference to the accompanying drawings, wherein like numbers reference like elements.

FIGS. 1A and 1B are diagrams showing a schematic configuration of the quartz-crystal vibrator, wherein FIG. 1A is a plan view, and FIG. 1B is a cross-sectional view.

DESCRIPTION OF EXEMPLARY EMBODIMENTS

In view of the problem described above, the inventors have invented an improved vibrating reed provided with vibrating arms each having a weight section at the tip thereof and a base having notches by incorporating the vibrating reed of Document 1 and the vibrating reed of Document 2 with each other in order for achieving improvement of the Q-value without increasing the size of the base (without increasing the overall size of the vibrating reed).

Although the improved vibrating reed obtains a certain level of improvement in Q-value, it has turned up from the analysis conducted by the inventors that a thermoelastic loss is caused by the following disincentives, and the further improvement in the Q-value is hindered.

1. In the flexural vibration, since the weight section is provided to the tip of each of the vibrating arms, the ratio of the distortion generated in a crotch section formed between the vibrating arms and the notches of the base with respect to the distortion generated in the vibrating arms is increased.

2. The temperature variation with respect to the reference temperature is induced due to the distortion generated in the crotch section and the notches. In this case, since the distortions generated respectively in the crotch section and the notches have a relationship of reversed sign (the relationship in which when tensile stress is generated in one of the crotch section and the notch, compressive stress is generated in the other thereof), the temperature variations in the respective crotch section and the notch also have the relationship of reversed sign.

3. A heat flow is caused due to the temperature variations with reversed signs induced respectively in the crotch section and the notch.

4. Since the heat flow is caused, namely the amount of temperature variation from the reference temperature decreases or increases with time, the energy, which could have been reconverted into the distortion, becomes unable to be taken out mechanically. In other words, the improved vibrating reed described above generates the thermoelastic loss in the flexural vibration due to the distortions caused in the crotch section formed between the vibrating arms and the notches of the base, and thus the further improvement of the Q-value is hindered.

Therefore, the inventors have created the invention for preventing the thermoelastic loss to thereby achieve further improvement of the Q-value. An embodiment in which the invention is put into practice will hereinafter be explained with reference to the accompanying drawings.

Embodiment

Figure 1A:
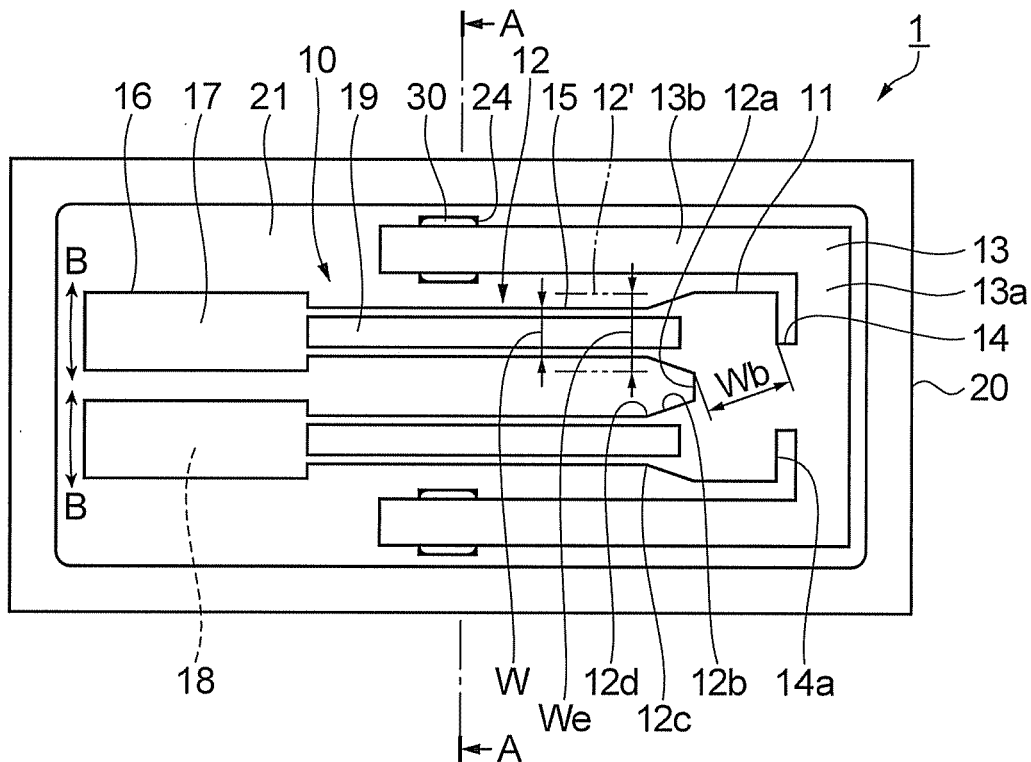
Figure 1B:
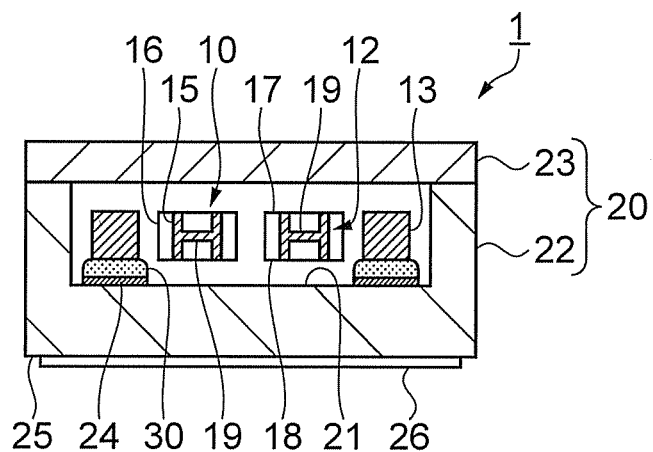

FIGS. 1A and 1B are schematic diagrams showing a general configuration of quartz-crystal vibrator as a vibration device. FIG. 1A is a plan view of the quartz-crystal vibrator viewed downward from the side of a lid (a lid member), and FIG. 1B is a cross-sectional view along the line A-A shown in FIG. 1A. It should be noted that the lid is omitted in the plan view for the sake of convenience.

As shown in FIGS. 1A and 1B, the quartz-crystal vibrator 1 is provided with a quartz-crystal vibrating reed 10 of a tuning-fork type as a vibrating reed vibrating in a flexural mode in the arrow B direction, and a package 20 for housing the quartz-crystal vibrating reed 10 inside to fix the quartz-crystal vibrating reed 10.

The quartz-crystal vibrating reed 10 including the base 11 is formed integrally with the base 11, and is provided with a pair of vibrating arms 12 extending in parallel to each other from one end of the base 11, and a support section 13 formed integrally with the base 11 and connected to the other end of the base 11.

The base 11 of the quartz-crystal vibrating reed 10 has a pair of notches 14 forming a portion with a width narrower than the width (the size thereof in a direction perpendicular to the longitudinal direction of the vibrating arm 12) of the one end thereof between the one end (the side of the vibrating arm 12) and the other end (the opposite side to the side where the vibrating arms 12 are disposed).

The vibrating arms 12 of the quartz-crystal vibrating reed 10 are each provided with an arm section 15 located on the side of the base 11, a weight section 16 having a width larger than that of the arm section 15 and located on the opposite side of the arm section 15 to the side of the base 11, and groove sections 19 provided to the respective principal surfaces 17, 18 of the arm section 15 along the longitudinal direction of the arm section 15 so that the cross-sectional shape of the vibrating arm 12 in the plane perpendicular to the longitudinal direction of the vibrating arm 12 becomes a roughly H-shape.

The support section 13 of the quartz-crystal vibrating reed 10 extends from the other end of the base 11 along the vibrating arms 12 to form a roughly U-shape in a plan view so as to get around the vibrating arms 12 to the both ends thereof, and is fixed to the internal bottom surface 21 of the package 20 at the vicinities of the tip portions thereof.

More specifically, the support section 13 has first projecting sections 13a projecting from the other end of the base 11 in a direction substantially perpendicular to the longitudinal direction of the vibrating arms 12, and second projecting sections 13b projecting from the respective first projecting sections 13a in a direction in which the vibrating arms 12 extend.

The package 20 is composed of a package base 22 having a recessed section, a lid 23 for covering the recessed section of the package base 22, and so on.

An aluminum oxide-based sintered body obtained by shaping and then calcining the ceramic green sheet, for example, is used as the package base 22. Further, as the lid 23, metal such as kovar, glass, and so on is used.

The internal bottom surface 21 of the package base 22 is provided with a pair of internal electrodes 24, and the external bottom surface 25 of the package base 22 is provided with a pair of external terminals 26. The pair of external terminals 26 are connected to the pair of internal electrodes 24 by internal wiring not shown.

It should be noted that the internal electrodes 24 and the external terminals 26 are each formed of a metal coating obtained by stacking coating films made of, for example, nickel and gold on a metalization layer made of, for example, tungsten.

It should be noted that the package can be mainly composed of a planar package base and a lid having a recessed section. Further, it is also possible to provide the recessed sections to the package base and the lid, respectively, in the package.

The support section 13 of the quartz-crystal vibrating reed 10 is bonded to the internal electrodes 24 of the package base 22 via a conductive adhesive 30 such as an epoxy group, a silicone group, or a polyimide group mixed with a conductive material such as a metal filler.

Thus, excitation electrodes not shown of the quartz-crystal vibrating reed 10 is electrically connected to the external terminals 26 via the internal electrodes 24.

It should be noted that as the bonding material between the quartz-crystal vibrating reed 10 and the internal electrodes 24 conductor bumps such as gold bumps or solder bumps can be used besides the conductive adhesive.

After the quartz-crystal vibrating reed 10 is bonded to the internal electrodes 24 of the package base 22, the lid 23 is bonded to the package base 22 to thereby airtightly seal the inside of the package 20 of the quartz-crystal vibrator 1.

It should be noted that the bonding between the lid 23 and the package base 22 is performed by, for example, seam welding using low-melting glass or a seam ring.

The quartz-crystal vibrating reed 10 of the quartz-crystal vibrator 1 oscillates (resonates) at a predetermined frequency (e.g., 32 kHz) in response to application of a drive signal from the outside via the external terminals 26, the internal terminals 24, the conductive adhesive 30, and the excitation electrodes.

The quartz-crystal vibrating reed 10 is set to have a mechanical resonant frequency f higher than a thermal relaxation frequency $f_0$ ($f > f_0$). Thus, as a result, the quartz-crystal vibrating reed 10 vibrates in the flexural mode in an adiabatic region.

Figure 2:
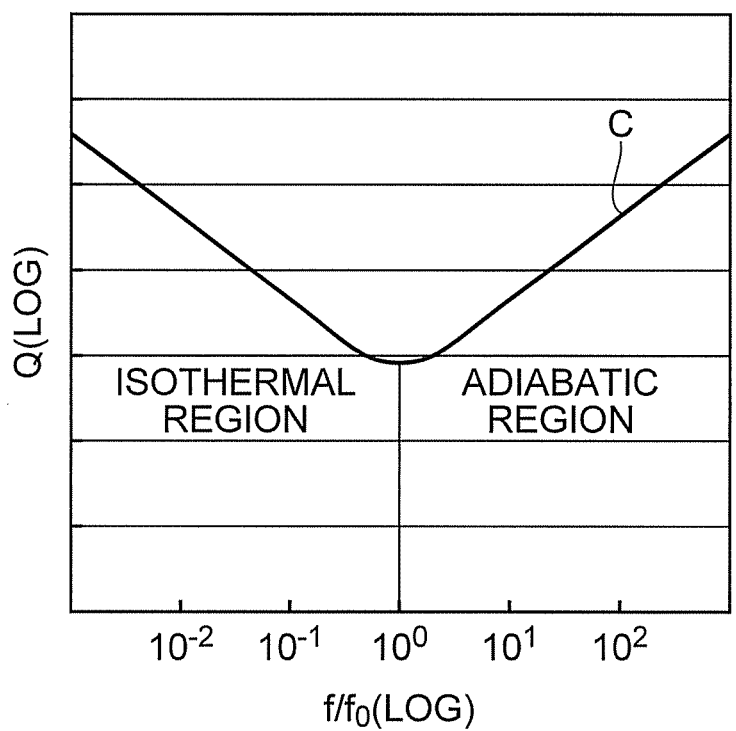
FIG. 2 is a schematic diagram for explaining an adiabatic region.

Here, an outline of the adiabatic region will be explained. FIG. 2 is a schematic diagram for explaining the adiabatic region.

In general, according to the relational expression between distortion and stress well known in the case of the internal friction of solids caused by a temperature difference, it is conceivable that the thermoelastic loss (a loss of the vibration energy caused by the thermal conduction generated between the compressed section and the expanded section of the vibrating reed vibrating in the flexural mode) has a local minimal Q-value at the relaxation frequency $f_m = 1/2\pi\tau$ (here, τ denotes the relaxation time corresponding to the time until the heat flow generation is almost stopped, namely the time until the thermal equilibrium state is reached) when the frequency changes in the vibrating reed in the flexural vibration mode.

In general, it is known that the relaxation frequency $f_m$ can be obtained by the following equation.

$$f_m = \pi k / (2\rho C_p a^2)$$

Here, "π" denotes the circle ratio, "k" denotes the thermal conductivity of the vibrating arm in the vibration direction (the flexural vibration direction), "ρ" denotes the mass density of the vibrating arm, "$C_p$" denotes the thermal capacity of the vibrating arm, and "a" denotes the width of the vibrating arm in the vibration direction (the flexural vibration direction).

The relationship between the Q-value and the frequency is generally represented by the curve C shown in FIG. 2. In FIG. 2, the frequency at which the Q-value takes the minimal value corresponds to the thermal relaxation frequency $f_0$.

Further, taking the point of $f/f_0 = 1$ as a boundary, the high frequency region ($1 < f/f_0$) where the resonant frequency f is higher than the thermal relaxation frequency $f_0$ corresponds to the adiabatic region, and the low frequency region ($1 > f/f_0$) corresponds to an isothermal region.

It should be noted that the quartz-crystal vibrating reed 10 preferably satisfies the following relationship.

$$f > \sqrt{f_0 f_1}$$

Here, "$f_0$" denotes the thermal relaxation frequency in the case in which the vibrating arm 12 takes the planar structure as a reference, and "$f_1$" denotes the thermal relaxation frequency in the case of taking the structure in which the vibrating arm 12 is provided with the groove section 19 as a reference.

By satisfying the relationship described above, the setting range of the shape of, for example, the vibrating arm 12 of the quartz-crystal vibrating reed 10 becomes broader than the relationship of $f > f_0$.

Assuming that the closest approach distance between the outer edge 14a of the notch 14 and the outer edge 12b of the crotch section 12a formed between the pair of vibrating arms 12 is a base flexion width Wb, the arm width of the vibrating arm 12' in the case of replacing the cross-sectional shape of the vibrating arm 12 in the plane perpendicular to the longitudinal direction of the vibrating arm 12 with the rectangular shape having the same thickness with the equivalent thermoelastic loss is an effective arm width We, the temperature difference caused in conjunction with the flexural vibration between the outer edge 14a of the notch 14 and the outer edge 12b of the crotch section 12a is denoted by "$d\Theta_b$," and the temperature difference caused in conjunction with the flexural vibration between the both ends (one end 12c, the other end 12d) of the root section of the vibrating arm 12 in the direction of the arm width W is denoted by "$d\Theta$," the quartz-crystal reed 10 satisfies the following relationship.

$$Wb > We \times d\Theta_b / d\Theta \text{ (where } d\Theta_b < d\Theta\text{)}$$

Figure 3:
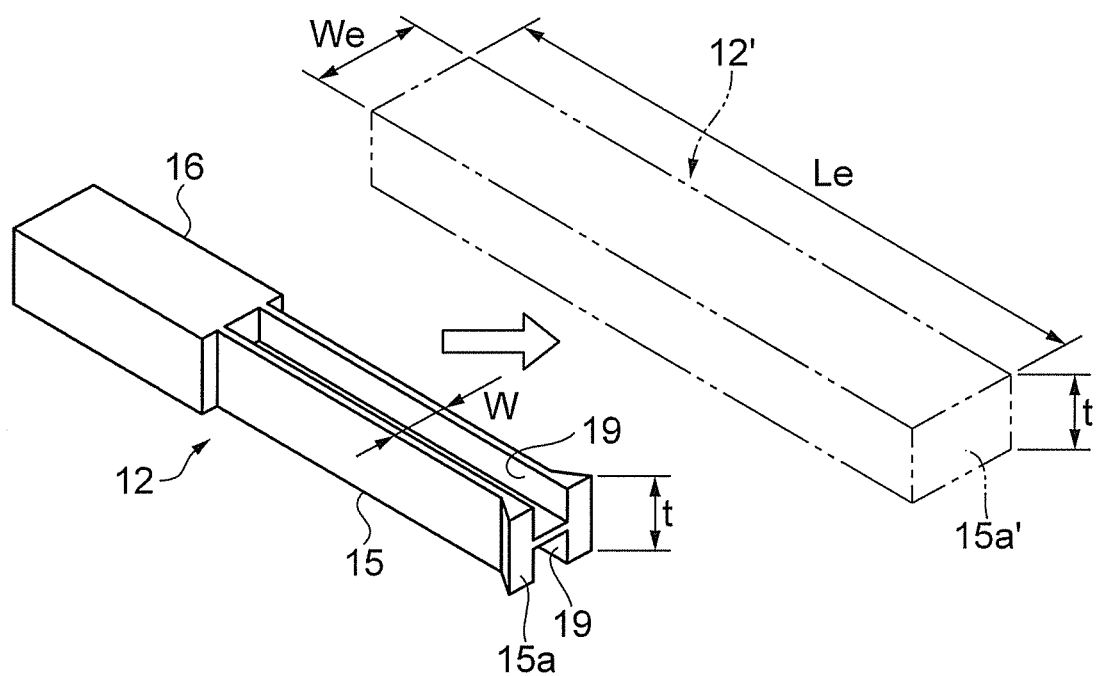
FIG. 3 is a schematic diagram for explaining an effective arm width of a vibrating arm.
Figure 4:
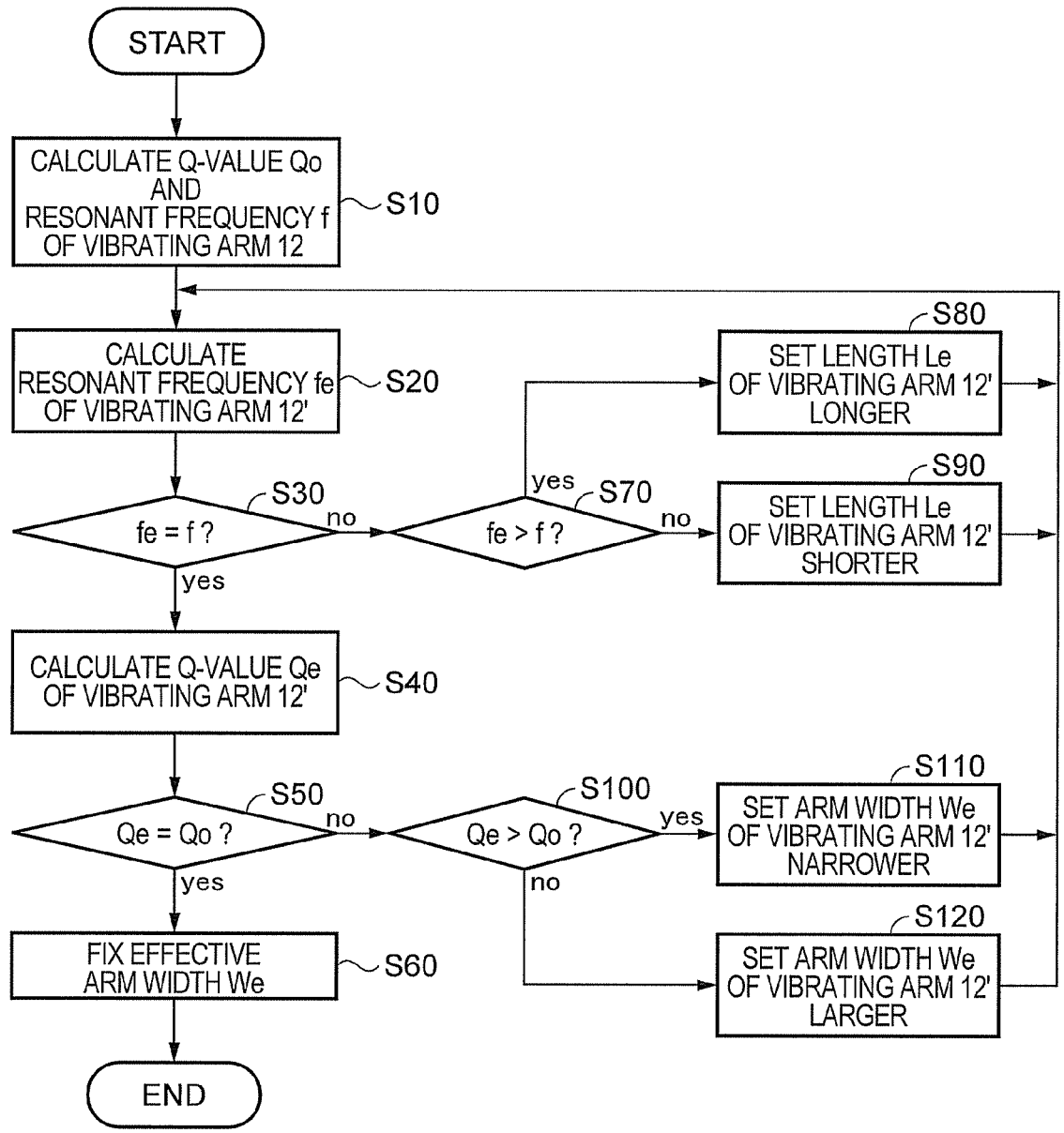
FIG. 4 is a flowchart showing a procedure of calculating the effective arm width of the vibrating arm.

Here, the effective arm width We of the vibrating arm 12 of the quartz-crystal vibrating reed 10 will be explained. FIG. 3 is a schematic diagram for explaining the effective arm width of the vibrating arm, and FIG. 4 is a flowchart showing the procedure of calculating the effective arm width of the vibrating arm.

As shown in FIG. 3, the effective arm width We of the vibrating arm 12 denotes the arm width We of the vibrating arm 12' in the case of replacing the actual cross-sectional shape (in this case, the cross-sectional shape having the substantially H-shape) of the vibrating arm 12 in the plane perpendicular to the longitudinal direction of the vibrating arm 12 with the rectangular shape having the same thickness t generating the thermoelastic loss identical to the thermoelastic loss generated in that cross-sectional shape, and replacing the whole vibrating arm 12 with the vibrating arm 12' having a prismatic shape.

It should be noted that when performing the replacement, the length Le of the vibrating arm 12' is adjusted so that the resonant frequency f of the vibrating arm 12 and the resonant frequency fe of the vibrating arm 12' become equal to each other.

Here, the procedure of calculating the effective arm width We of the vibrating arm 12 will be explained with reference to FIGS. 3 and 4.

In the step S10, firstly the Q-value $Q_0$ and the resonant frequency f taking only the thermoelastic loss into consideration are calculated based on the shape of the actual vibrating arm 12 setting the end surface 15a on the side of the base 11 to a fixed condition. It should be noted that the Q-value is calculated using the finite element method.

Subsequently, in the step S20, the resonant frequency fe is calculated setting the end surface 15a' on the side of the base 11 of the vibrating arm 12' having the rectangular cross-sectional shape in which the cross-sectional shape is set to a rectangular shape to the fixed condition, and setting the tentative length Le.

Subsequently, in the step S30, whether or not the resonant frequency fe of the vibrating arm 12' having the rectangular cross-sectional shape is the same as the resonant frequency f of the actual vibrating arm 12 calculated in the step S10 is checked. If they are the same, the process proceeds to the step S40, and if they are different from each other, the process proceeds to the step S70.

Subsequently, in the step S40, the Q-value Qe taking only the thermoelastic loss into consideration is calculated setting the end surface 15a' on the side of the base 11 of the vibrating arm 12' having the rectangular cross-sectional shape to the fixed condition.

Subsequently, in the step S50, whether or not the Q-value Qe of the vibrating arm 12' having the rectangular cross-sectional shape is the same as the Q-value $Q_0$ of the actual vibrating arm 12 calculated in the step S10 is checked. If they are the same, the process proceeds to the step S60, and if they are different from each other, the process proceeds to the step S100.

In the step S60, since the Q-value Qe of the vibrating arm 12' having the rectangular cross-sectional shape is the same as the Q-value $Q_0$ of the actual vibrating arm 12, the effective arm width We is fixed to be the present value.

In the step S70, whether or not the resonant frequency fe of the vibrating arm 12' having the rectangular cross-sectional shape is higher than the resonant frequency f of the actual vibrating arm 12 is checked. If it is higher, the process proceeds to the step S80, and if it is not higher (it is lower), the process proceeds to the step S90.

In the step S80, the length Le of the vibrating arm 12' having the rectangular cross-sectional shape is set longer than the present value, and the process proceeds to the step S20.

In the step S90, the length Le of the vibrating arm 12' having the rectangular cross-sectional shape is set shorter than the present value, and the process proceeds to the step S20.

In the step S100, whether or not the Q-value Qe of the vibrating arm 12' having the rectangular cross-sectional shape is larger than the Q-value $Q_0$ of the actual vibrating arm 12 is checked. If it is larger, the process proceeds to the step S110, and if it is not larger, the process proceeds to the step S120.

In the step S110, the arm width (the effective arm width) We of the vibrating arm 12' having the rectangular cross-sectional shape is set narrower than the present value, and the process proceeds to the step S20.

In the step S120, the arm width (the effective arm width) We of the vibrating arm 12' having the rectangular cross-sectional shape is set larger than the present value, and the process proceeds to the step S20.

As described above, by executing the steps until the process reaches the step S60, the effective arm width We of the vibrating arm 12 of the quartz-crystal vibrating reed 10 is calculated.

Here, the temperature ratio ($d\Theta_b/d\Theta$) will be described.

The temperature differences $d\Theta_b$, $d\Theta$ are calculated by measuring the distortion in conjunction with the flexural vibration of the quartz-crystal vibrating reed 10 and obtaining the difference between the absolute temperature of the portion where the distortion is caused and the reference absolute temperature.

The distortion of the quartz-crystal vibrating reed 10 can be measured by the measurement method disclosed in JP-A-10-185526 or a method of measuring the spatial distribution of the displacement of the quartz-crystal vibrating reed 10 using a laser Doppler device or the like. The distortion $S_{kl}$ is a space derivative of the displacement, and is therefore expressed by the following formula.

$$S_{kl} = \frac{1}{2}\left(\frac{\partial u_k}{\partial x_l} + \frac{\partial u_l}{\partial x_k}\right)$$

Here, "k," "l" are assumed to be integers of 1 through 3 corresponding to the space coordinates x, y, and z (the same is applied to the suffixes in the following formula).

If an approximation is performed in the condition in which the entropy does not increase, the difference $\theta = \Theta' - \Theta$ between the absolute temperature $\Theta'$ of the portion where the distortion $S_{kl}$ is caused and the reference absolute temperature $\Theta$ can be calculated by Formula (1) below. It should be noted that the summation convention is applied to each of the suffixes in Formula (1).

$$\theta = -\frac{\Theta}{C^s}\lambda_{kl}S_{kl} \quad (1)$$

Here, $\lambda_{kl}=c_{ijkl}\alpha_{ij}$ is true, wherein "$c_{ijkl}$" denotes an elastic stiffness constant, and $\alpha_{ij}$ denotes a thermal expansion coefficient.

Further, $C^s=\rho C_p-\Theta\alpha_{kl}\lambda_{kl}$ true, wherein "$\rho$" denotes a mass density, "$C_p$" denotes the thermal capacity, and "$\alpha_{kl}$" denotes the thermal expansion coefficient.

According to the above, if the difference from the reference absolute temperature $\Theta$ occurs, for example, the absolute temperature $\Theta'_{b1}$ of the outer edge 12b of the crotch section 12a shown in FIG. 1A is $\Theta'_{b1}=\Theta+\theta_1$, and the absolute temperature $\Theta'_{b2}$ of the outer edge 14a of the notch 14 is $\Theta'_{b2}=\Theta+\theta_2$, the temperature difference $d\Theta_b$ can be obtained by the following formula.

$$d\Theta b = |\Theta'_{b1} - \Theta'_{b2}|$$
$$= |(\Theta + \theta_1) - (\Theta + \theta_2)|$$
$$= |\theta_1 - \theta_2|$$

Further, the temperature difference $d\Theta$ can be obtained in substantially the same manner. In the detailed description, if, for example, the absolute temperature $\Theta'_c$ of the one end 12c of the root section of the vibrating arm 12 shown in FIGS. 1A and 1B in the direction of the arm width W is $\Theta'_c=\Theta+\theta_3$, and the absolute temperature $\Theta^d$ of the other end 12d is $\Theta'_d=\Theta+\theta_4$, the temperature difference $d\Theta$ can be obtained by the following formula.

$$d\Theta = |\Theta'_c - \Theta'_d|$$
$$= |(\Theta + \theta_3) - (\Theta + \theta_4)|$$
$$= |\theta_3 - \theta_4|$$

In the temperature ratio, the relationship of $d\Theta_b<d\Theta$ is preferable, and the relationship of $d\Theta_b<<d\Theta$ is more preferable.

It should be noted that since the relationship of $d\Theta_b=d\Theta$ means that the distortion caused in the crotch section 12a and the distortion caused in the vibrating arm 12 are equivalent to each other, the vibration leakage to the base 11 might be increased in this case.

It should be noted that the temperature differences $d\Theta_b$, $d\Theta$ can directly measured using a thermometer such as a radiation thermometer, or can be calculated by the finite element method based on the accurate measurement of the shape of the vibrating reed.

As described above, in the quartz-crystal vibrator 1, the resonant frequency f of the quartz-crystal vibrating reed 10 is set to be higher than the thermal relaxation frequency $f_0$, the vibrating arm 12 is provided with the weight section 16 and the groove section 19, and assuming that the closest approach distance between the outer edge 14a of the notch 14 and the outer edge 12b of the crotch section 12a formed between the pair of vibrating arms 12 is a base flexion width Wb, the arm width of the vibrating arm 12' in the case of replacing the cross-sectional shape of the vibrating arm 12 in the plane perpendicular to the longitudinal direction of the vibrating arm 12 with the rectangular shape having the same thickness with the equivalent thermoelastic loss is an effective arm width We, the temperature difference caused in conjunction with the flexural vibration between the outer edge 14a of the notch 14 and the outer edge 12b of the crotch section 12a is denoted by "$d\Theta_b$," and the temperature difference caused in conjunction with the flexural vibration between the both ends (one end 12c, the other end 12d) of the root section of the vibrating arm 12 in the direction of the arm width W is denoted by "$d\Theta$," the following relationship is satisfied: Wb>We×$d\Theta_b$/$d\Theta$ (where $d\Theta_b<d\Theta$).

Thus, in the quartz-crystal vibrator 1, since the thermoelastic loss caused in the cross-sectional surface of the base 11 of the quartz-crystal vibrating reed 10 becomes smaller than the thermoelastic loss caused in the cross-sectional surface of the vibrating arm 12, the deterioration of the Q-value of the quartz-crystal vibrating reed 10 caused by the thermoelastic loss of the base 11 is prevented, and the improvement of the Q-value can be achieved.

It should be noted that, as an example, in the quartz-crystal vibrator 1, it is confirmed that the Q-value taking only the thermoelastic loss into consideration is improved by approximately 20% compared to the case of not satisfying the relationship described above.

In addition, in the quartz-crystal vibrator 1, since the ratio (the temperature ratio) between the temperature difference $d\Theta_b$ caused in the base 11 and the temperature difference $d\Theta$ caused in the vibrating arm 12 is reflected in the relationship between the base flexion width Wb and the effective arm width We, the base flexion width Wb and the effective arm width We can be set in a broader range compared to the case in which the ratio is not reflected.

It should be noted that in the quartz-crystal vibrator 1 it is also possible to arrange that the relationship of Wb>We is satisfied instead of reflecting the ratio between the temperature difference $d\Theta_b$ caused in the base 11 and the temperature difference $d\Theta$ caused in the vibrating arm 12 in the relationship between the base flexion width Wb and the effective arm width We.

In other words, it is also possible that in the quartz-crystal vibrator 1 the resonant frequency f of the quartz-crystal vibrating reed 10 is set to be higher than the thermal relaxation frequency $f_0$, the vibrating arm 12 is provided with the weight section 16 and the groove section 19, and assuming that the closest approach distance between the outer edge 14a of the notch 14 and the outer edge 12b of the crotch section 12a formed between the pair of vibrating arms 12 is the base flexion width Wb, and the arm width of the vibrating arm 12' in the case of replacing the cross-sectional shape of the vibrating arm 12 in the plane perpendicular to the longitudinal direction of the vibrating arm 12 with the rectangular shape with the same thickness having the equivalent thermoelastic loss is the effective arm width We, the relationship of Wb>We is satisfied.

According to the above, in the quartz-crystal vibrator 1, as an advantage other than the improvement of the Q-value, reduction of the design time of the quartz-crystal vibrating reed 10 can be achieved since the number of parameters to be fed-back is smaller compared to the case of reflecting the ratio between the temperature difference $d\Theta_b$ caused in the base 11 and the temperature difference $d\Theta$ caused in the vibrating arm 12 described above.

It should be noted that in the quartz-crystal vibrator 1, it is not required for the groove section 19 of the vibrating arm 12 of the quartz-crystal vibrating reed 10 to be provided to both of the principal surfaces 17, 18, but is sufficiently provided at least either one of the principal surfaces 17, 18. This is also applied to the following modified examples.

MODIFIED EXAMPLES

Here, modified examples of the quartz-crystal vibrator according to the embodiment described above will be explained.

FIGS. 5A through 5D, and 6 are schematic diagrams showing the variations of the quartz-crystal vibrating reed in the quartz-crystal vibrators of the modified examples. It should be noted that the common sections to the embodiment are denoted with the same reference numerals, the explanation therefor will be omitted, and different sections from the embodiment described above will mainly be explained.

In the quartz-crystal vibrator, the quartz-crystal vibrating reeds having the shapes shown in FIGS. 5A through 5D, and 6, for example, can be used besides the shape of the quartz-crystal vibrating reed 10 described above.

Figure 5A:
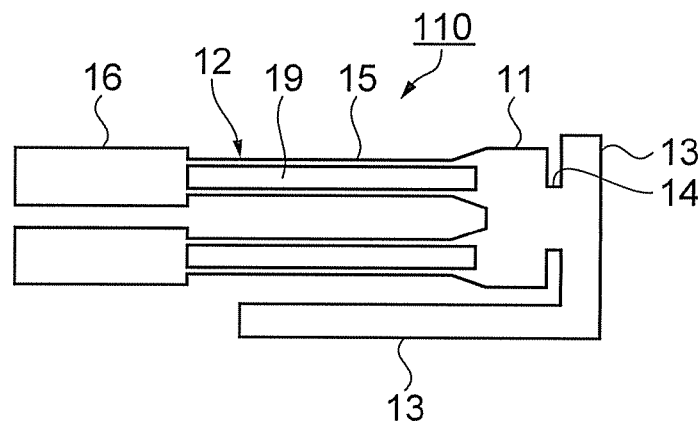
FIGS. 5A through 5D are schematic diagrams respectively showing variations of quartz-crystal vibrating reeds in the quartz-crystal vibrators of modified examples.

As shown in FIG. 5A, in the quartz-crystal vibrating reed 110, one side of the support section 13 is formed to be shorter. According to this configuration, the planar size of the quartz-crystal vibrating reed 110 can be made smaller compared to the embodiment described above.

Figure 5B:
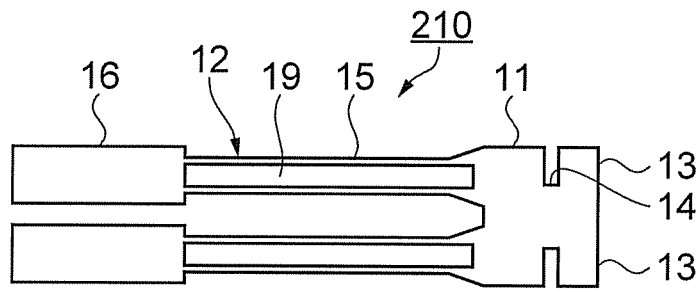

As shown in FIG. 5B, in the quartz-crystal vibrating reed 210, both sides of the support section 13 are formed to be shorter. According to this configuration, the planar size of the quartz-crystal vibrating reed 210 can be made further smaller compared to the embodiment described above.

Figure 5C:
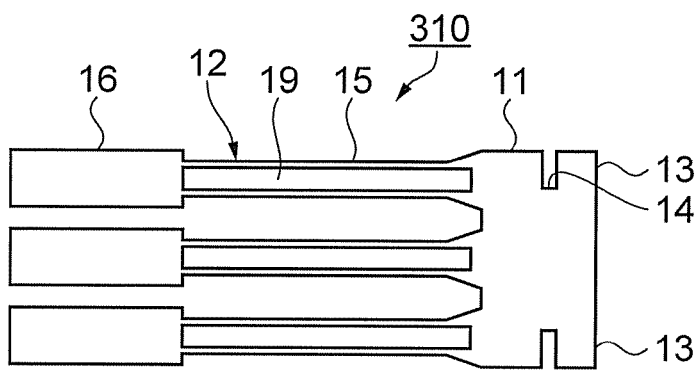

As shown in FIG. 5C, the quartz-crystal vibrating reed 310 is provided with three vibrating arms 12. According to this configuration, in the quartz-crystal vibrating reed 310, anti-plane vibration (the flexural vibration in the thickness direction of the quartz-crystal vibrating reed 310) of one of the vibrating arms 12 becomes possible.

It should be noted that the number of the vibrating arms 12 can arbitrarily be set to 2, 3, 4, . . . , n ("n" is an integer), for example, in accordance with the purpose thereof.

Figure 5D:
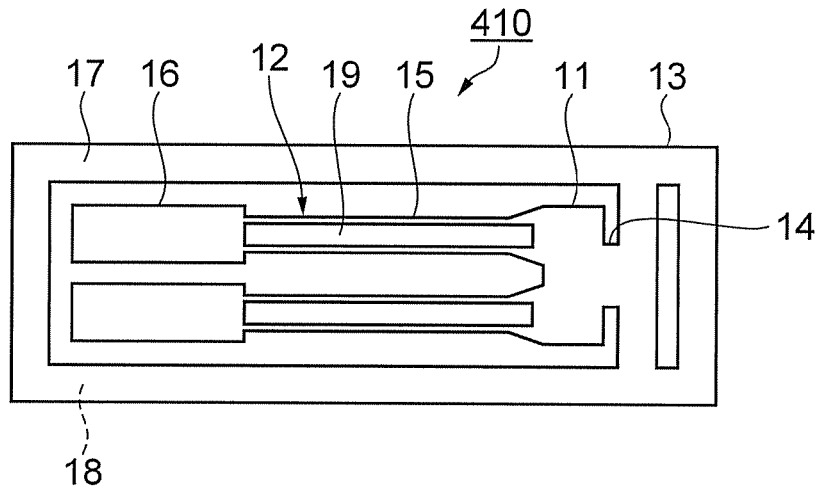

As shown in FIG. 5D, in the quartz-crystal vibrating reed 410, the support section 13 is formed to have a frame-like shape surrounding the vibrating arms 12 and the base 11.

Further, on one principal surface 17 of the frame-like support section 13 of the quartz-crystal vibrating reed 410, there is bonded an outer circumferential frame section of the lid not shown having the recessed section, and on the other principal surface 18 thereof, there is bonded an outer circumferential frame section of the package base not shown having the recessed section.

According to this configuration, the quartz-crystal vibrating reed 410 has the support section 13 sandwiched between the lid and the package base, and the support section 13 also functions as a part of the package not shown. Thus, the quartz-crystal vibrator having the planar size roughly the same as the quartz-crystal vibrating reed 410 can be provided.

Figure 6:
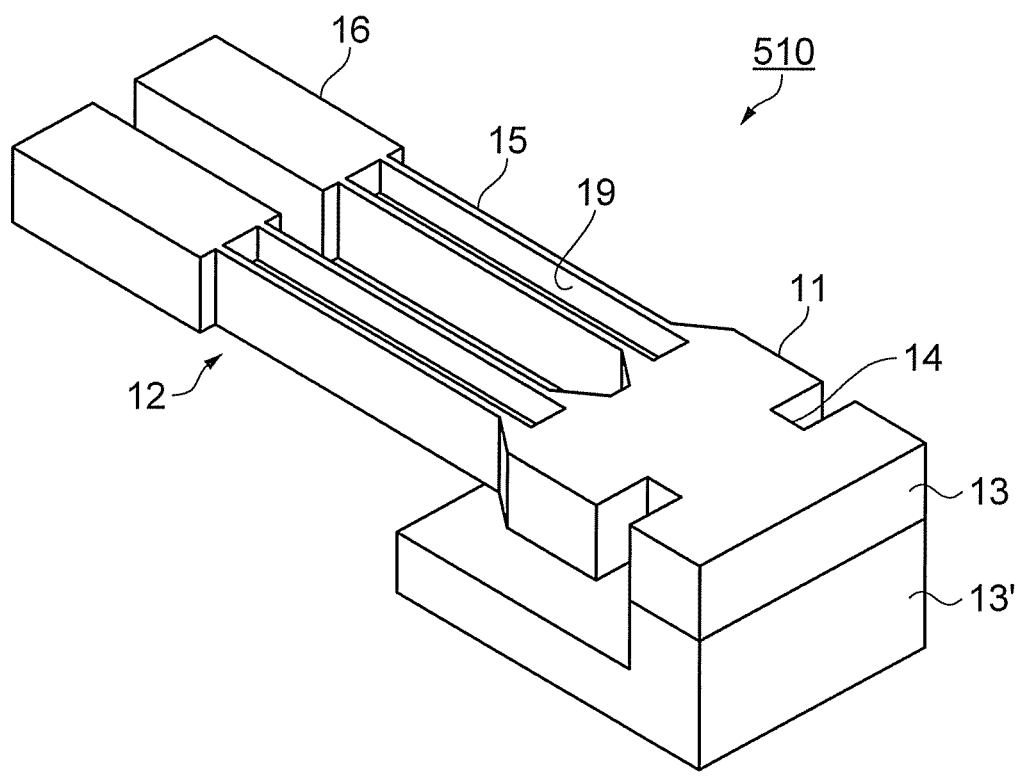
FIG. 6 is a schematic diagram showing a variation of the quartz-crystal vibrating reed in the quartz-crystal vibrator of a modified example.

As shown in FIG. 6, in the quartz-crystal vibrating reed 510, the support section 13 is bonded to a separate extension support section 13' formed to have an L-shape (an inverse L-shape) viewed from the side surface.

According to this configuration, in the quartz-crystal vibrating reed 510, inhibition of the vibration of the vibrating arm 12 caused by the support section 13 can be prevented by the extension support section 13' without increasing the planar size.

It should be noted that although in the embodiment and the modified examples described above, the explanation is presented citing the quartz-crystal vibrator as an example of the vibration device, the invention is not limited thereto, but can be a quartz-crystal oscillator or the like incorporating an IC chip for driving the quartz-crystal vibrating reed, or a pressure sensor, a gyro sensor, or the like obtained by adding a detection circuit or the like to the IC chip.

Further, the vibration device such as the quartz-crystal vibrator or the quartz-crystal oscillator can preferably used as a timing device in an electronic device such as a cellular phone, an electronic book, a personal computer, a television set, a digital still camera, a video camera, a video cassette recorder, a car navigation system, a pager, a personal digital assistance, an electric calculator, a word processor, a workstation, a video phone, a POS terminal, a device equipped with a touch panel, and in either case, the electronic device having the advantages explained in the embodiment and the modified examples described above can be provided.

Further, the material of the vibrating reed is not limited to the quartz-crystal, but can be a piezoelectric substance such as lithium tantalate ($LiTaO_3$), lithium tetraborate ($Li_2B_4O_7$), lithiumniobate ($LiNbO_3$), lead zirconium titanate (PZT), zinc oxide (ZnO), aluminum nitride (AlN), or a semiconductor such as silicon (Si).

Further, the drive method of the flexural vibration can be the electrostatic drive using the coulomb force besides those using the piezoelectric effect of the piezoelectric substance.

The entire disclosure of Japanese Patent Application Nos: 2009-257704, filed Nov. 11, 2009 and 2010-196512, filed Sep. 2, 2010 are expressly incorporated by reference herein.

What is claimed is:

1. A vibration device comprising:
    a vibrating reed including
        a base having a notch between one end and the other end,
        a plurality of vibrating arms extending from the one end of the base, and each including an arm section, a weight section located on an opposite side of the arm section to the base side and having a width larger than a width of the arm section, and a groove section provided to at least one of both principal surfaces of the arm section along a longitudinal direction of the arm section, and
        a support section connected to the other end of the base,
    wherein a mechanical resonant frequency f of the vibrating reed is higher than a thermal relaxation frequency $f_0$ of the vibrating reed, and
    assuming that
        a closest approach distance between an outer edge of the notch and an outer edge of a crotch section formed between the vibrating arms is a base flexion width Wb, and
        an arm width of the vibrating arm in a case of replacing a cross-sectional shape of the vibrating arm in a plane perpendicular to the longitudinal direction of the vibrating arm with a rectangular shape having a thermoelastic loss equivalent to a thermoelastic loss of the cross-sectional shape and a thickness equal to a thickness of the cross-sectional shape is an effective arm width We,
    a relationship of Wb>We is satisfied.

2. The vibration device according to claim 1, wherein the support section has
    a first projecting section extending from the other end of the base in a direction substantially perpendicular to the longitudinal direction of the vibrating arm, and
    a second projecting section extending from the first projecting section in a direction in which the vibrating arm extends.

3. The vibration device according to claim 1, further comprising:
    an IC chip adapted to drive the vibrating reed,
    wherein the vibration device functions as an oscillator.

4. An electronic device comprising:
    the vibration device according to claim 1.

5. A vibration device comprising:
    a vibrating reed including
        a base having a notch between one end and the other end,
        a plurality of vibrating arms extending from the one end of the base, and each including an arm section, a weight section located on an opposite side of the arm section to the base side and having a width larger than a width of the arm section, and a groove section provided to at least one of both principal surfaces of the arm section along a longitudinal direction of the arm section, and
        a support section connected to the other end of the base,
    wherein a mechanical resonant frequency f of the vibrating reed is higher than a thermal relaxation frequency $f_0$, and assuming that
        a closest approach distance between an outer edge of the notch and an outer edge of a crotch section formed between the vibrating arms is a base flexion width Wb,
        an arm width of the vibrating arm in a case of replacing a cross-sectional shape of the vibrating arm in a plane perpendicular to the longitudinal direction of the vibrating arm with a rectangular shape having a thermoelastic loss equivalent to a thermoelastic loss of the cross-sectional shape and a thickness equal to a thickness of the cross-sectional shape is an effective arm width We,
        a temperature difference caused in conjunction with a flexural vibration between the outer edge of the notch and the outer edge of the crotch section is $d\Theta_b$, and
        a temperature difference caused in conjunction with a flexural vibration between both ends of a root section of the vibrating arm in an arm width direction is $d\Theta$,
    the following relationship is satisfied;

$$Wb > We \times d\Theta_b / d\Theta \text{ (where } d\Theta_b < d\Theta\text{)}.$$

6. The vibration device according to claim 5, wherein the support section has
    a first projecting section extending from the other end of the base in a direction substantially perpendicular to the longitudinal direction of the vibrating arm, and
    a second projecting section extending from the first projecting section in a direction in which the vibrating arm extends.

7. The vibration device according to claim 5, further comprising:
    an IC chip adapted to drive the vibrating reed,
    wherein the vibration device functions as an oscillator.

8. An electronic device comprising:
    the vibration device according to claim 5.

* * * * *